United States Patent [19]
Miki

[11] Patent Number: 5,504,445
[45] Date of Patent: Apr. 2, 1996

[54] SINE WAVE GENERATING CIRCUIT

[75] Inventor: Tsutomu Miki, Itami, Japan

[73] Assignee: Mitsubishi Denki Kabushiki Kaisha, Tokyo, Japan

[21] Appl. No.: 894,645

[22] Filed: Jun. 5, 1992

[30] Foreign Application Priority Data

Jan. 6, 1992 [JP] Japan ................................ 4-000228

[51] Int. Cl.⁶ ............................ H03K 4/02; H03K 3/80
[52] U.S. Cl. ........................ 327/129; 327/106; 327/107
[58] Field of Search ........................... 328/14; 307/572; 327/105, 106, 107, 126, 129

[56] References Cited

U.S. PATENT DOCUMENTS

| | | | |
|---|---|---|---|
| 3,484,777 | 6/1965 | Delagrange | 328/14 |
| 3,657,657 | 4/1972 | Jefferson | 328/14 |
| 3,838,414 | 9/1974 | Wiles | 328/14 |
| 3,992,680 | 11/1976 | Herzl | 328/14 |
| 4,205,241 | 5/1980 | Fisher et al. | 328/14 |
| 4,368,432 | 1/1983 | Levy | 328/14 |
| 4,403,113 | 9/1983 | Ogita | 328/14 |
| 4,404,430 | 9/1983 | Ogita | 328/14 |
| 4,446,436 | 5/1984 | Ireland | 328/14 |
| 4,665,372 | 5/1987 | Schwartz | 328/14 |
| 5,111,072 | 5/1992 | Seidel | 307/572 |
| 5,121,069 | 6/1992 | Burns et al. | 328/14 |
| 5,130,571 | 7/1992 | Carroll | 307/572 |

FOREIGN PATENT DOCUMENTS 0286504  11/1989  Japan ........................ 328/14

OTHER PUBLICATIONS

Simple Circuit Generates Sine Wave Digitally EDN vol. 23, No. 2 (Jan. 20, 1978).
Rom Look Up Generates Sine Wave In Frequency Synthesizer.

Primary Examiner—Timothy P. Callahan
Assistant Examiner—T. Lam
Attorney, Agent, or Firm—Oblon, Spivak, McClelland, Maier & Neustadt

[57] ABSTRACT

There is disclosed a sine wave generating circuit including a counter (11) for counting clocks (CLK) to provide count results (B0 to B4), a control timing generating circuit (12) for converting the count results (B0 to B4) into switching control signals (D0 to D10), a synchronous circuit (13) for adjusting the timing of the switching control signals (D0 to D10) to provide switching control signals (Q0 to Q10), a weighted resistor voltage-dividing circuit (14) for voltage-dividing potentials $V_{D2}$ and $V_{S2}$ by means of resistors to transmit the divided potentials sequentially to a low pass filter (15) in accordance with the switching control signals (Q0 to Q10) given from the synchronous circuit (13), and the low pass filter (15) formed of a switched capacitor having a transmission zero point which is a frequency (fCLK) of the clock (CLK). Since the resistors are set such that the divided potentials are values for a sine wave, the sine wave has high accuracy and low distortion factor. Since the transmission characteristics of the low pass filter is variable depending on the clock frequency, the sine wave having a variable frequency and good effects of suppressing high-frequency components is achieved.

14 Claims, 9 Drawing Sheets

SINE WAVE GENERATING CIRCUIT

BACKGROUND OF THE INVENTION

1. Field of the Invention

The present invention relates to a sine wave generating circuit for use in the fields of communication, audible signal and the like.

2. Description of the Background Art

FIG. 8 is a circuit diagram of a conventional sine wave generating circuit. A 5-bit counter 1 counts clocks CLK to apply count results B0 to B4 to a ROM 2 in the form of addresses A0 to A4. The ROM 2 prestores 4-bit data which approximate a sine wave, and outputs 4-bit data D0 to D3 specified by the addresses A0 to A4. A 4-bit flip-flop 3 transforms the data D0 to D3 into signals Q0 to Q3, which are inputted to a D/A converter 4. The D/A converter 4 outputs an analog voltage. A low pass filter 5 suppresses high-frequency noises in the analog voltage. That is, the 4-bit data, which are stored in the ROM 2 and approximate the sine wave, are sequentially read out in response to the clocks CLK and are digital-to-analog converted to generate the sine wave through the low pass filter 5.

The conventional sine wave generating circuit, however, outputs only waveforms having quantization errors as against an ideal sine wave because the data D0 to D3 which approximate the sine wave are a 4-bit signal. The open circles of FIG. 9 indicate outputs of the D/A converter 4 in response to the clock CLK. Assuming that a maximum absolute value of the outputs is one, the outputs are, if arranged in an ascending order, $-1, -15/16, -13/16, -11/16, -9/16, -6/16, -3/16, 0, 3/16, 6/16, 9/16, 11/16, 13/16, 15/16, 1$. The closed circles of FIG. 9 indicate ideal values for the sine wave $\sin(k\pi/16)$ (k is an integer) in response to the clock CLK in corresponding relation to the open circles. The solid lines of FIG. 9 connect the adjacent closed circles.

The output waveform of the filter 5 of FIG. 8 has a large distortion factor due to the quantization errors. To reduce the distortion factor, the number of bits in data for circuits should be increased. For this purpose, the counter 1, ROM 2 and D/A converter 4 must be capable of dealing with a large number of bits. It is also necessary to increase the order of the low pass filter 5. The increasing size of the whole circuitry has been a problem.

When the data are outputted from the D/A converter 4 at a higher frequency in response to the clock CLK outputted at shorter intervals, the high frequency is not appropriately suppressed because of the fixed characteristics of the low pass filter. As a result, another problem arises that a variable frequency of the sine wave to be generated is not achieved.

SUMMARY OF THE INVENTION

According to the present invention, a sine wave generating circuit comprises: an oscillating circuit for generating an approximate sine wave from clock pulses having a first frequency, the approximate sine wave having a second frequency; and a low pass filter connected to the oscillating circuit and having a pass band corresponding to the first frequency for filtering the approximate sine wave, the first frequency being variable, the pass band of the low pass filter varying depending on variation in the first frequency.

According to another aspect of the present invention, a sine wave generating circuit comprises: control means for producing a switching control signal from clock pulses having a first frequency; a weighted resistor voltage-dividing circuit controlled by the control means for voltage-dividing a predetermined potential difference upon receipt of the switching control signal to generate a plurality of corresponding potentials, the weighted resistor voltage-dividing circuit extracting the corresponding potentials sequentially in synchronism with the clock pulses to generate an approximate sine wave having a second frequency; and a low pass filter for filtering the approximate sine wave.

The low pass filter, which has the pass band varied in accordance with the first frequency of the clock pulses, transmits the approximate sine wave sufficiently and suppresses the first frequency of the clock pulses sufficiently independently of increase or decrease in the second frequency. The weighted resistor voltage-dividing circuit voltage-divides the predetermined potential difference in accordance with the switching control signal to generate symmetrical quarter cycle waveforms of the approximate sine wave.

The weighted resistor voltage-dividing circuit divides the predetermined potential difference into the plurality of potentials corresponding to the sine wave. The potentials are sequentially read out through switches operative to open and close by the clock pulses. The sine wave generating circuit of the present invention, therefore, generates the stairlike approximate sine wave having small quantization errors. The low pass filter for suppressing the high-frequency components of the approximate sine wave has the pass band varied in accordance with the frequency of the clock pulses. Therefore, the high-frequency components are excellently suppressed when the frequency of the clock pulses and, accordingly, the frequency of the sine wave to be generated increase.

The sine wave generating circuit of the present invention generates the sine wave of high accuracy and low distortion factor, which sine wave has a variable frequency.

It is an object of the present invention to provide a sine wave generating circuit which generates a sine wave having a low distortion factor and high accuracy without increase in circuitry size and having a variable frequency.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
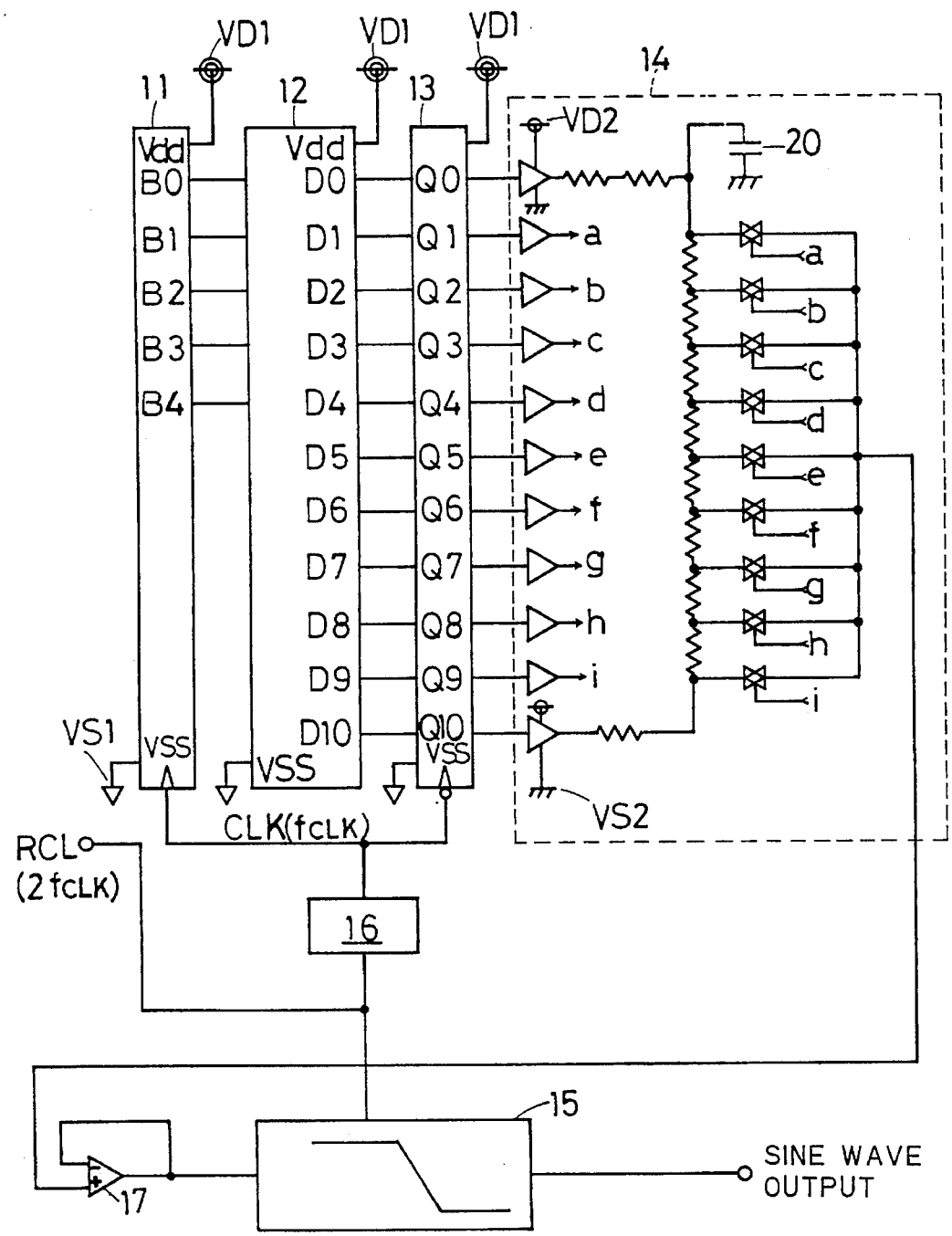
FIG. 1 is a circuit diagram of a first preferred embodiment according to the present invention.
Figure 2:
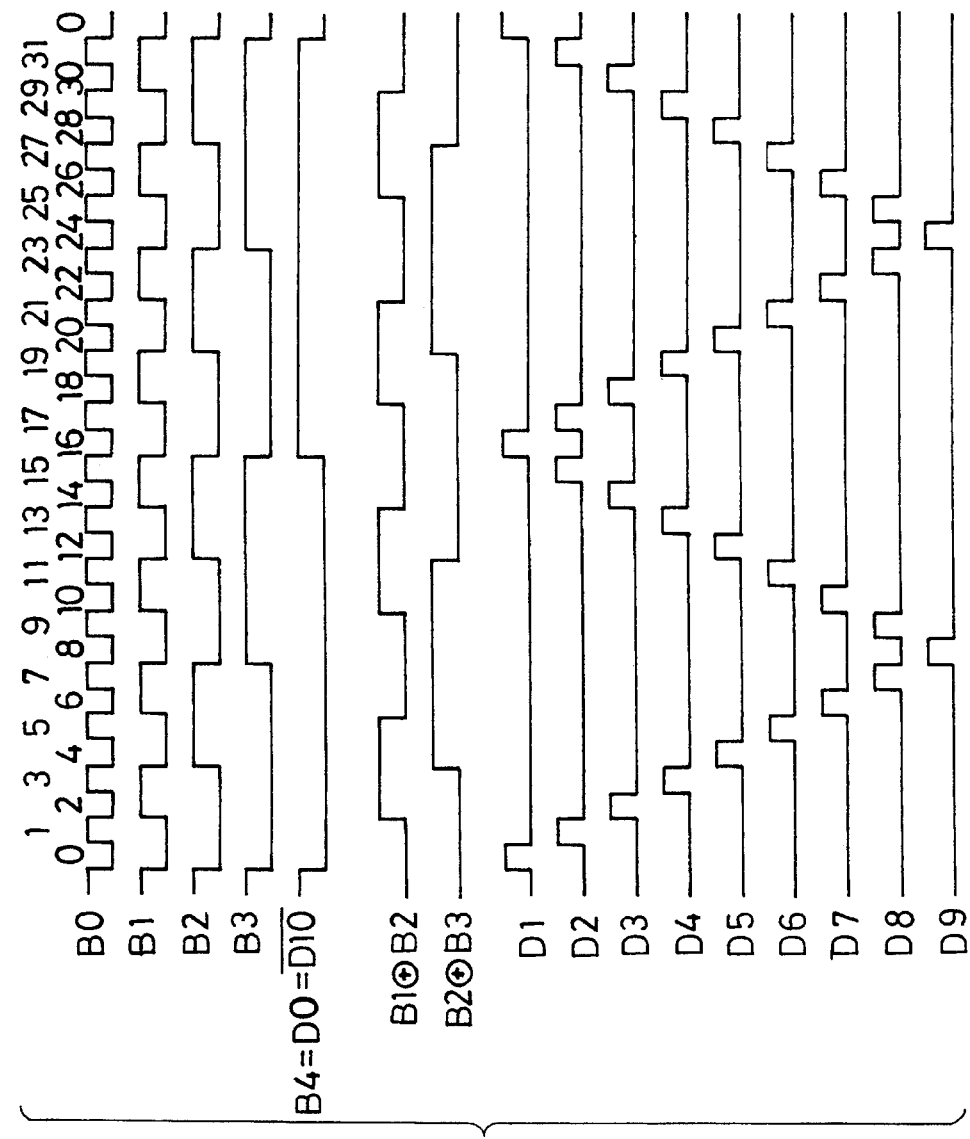
FIG. 2 is a timing chart of the first preferred embodiment.

FIG. 1 is a circuit diagram of a sine wave generating circuit according to a first preferred embodiment of the present invention. A 5-bit counter 11 counts inputted clocks CLK to apply count results B0 to B4 to a control timing generating circuit 12. There are shown in FIG. 2 output waveforms of the count results B0 to B4. The count result B0 is a binary logical signal having the same frequency as a frequency fCLK of the clock CLK. The count result B0 is frequency-divided by two once to four times to provide the count results B1, B2, B3, B4, respectively.

The count results B0 to B4 are inputted to the control timing generating circuit 12, in which switching control signals D0 to D10 are produced by the structure and operations described later. A synchronous circuit 13 regulates delays of the switching control signals D0 to D10 generated in the control timing generating circuit 12 to produce switching control signals Q0 to Q10, which are inputted to a weighted resistor voltage-dividing circuit 14.

Figure 3:
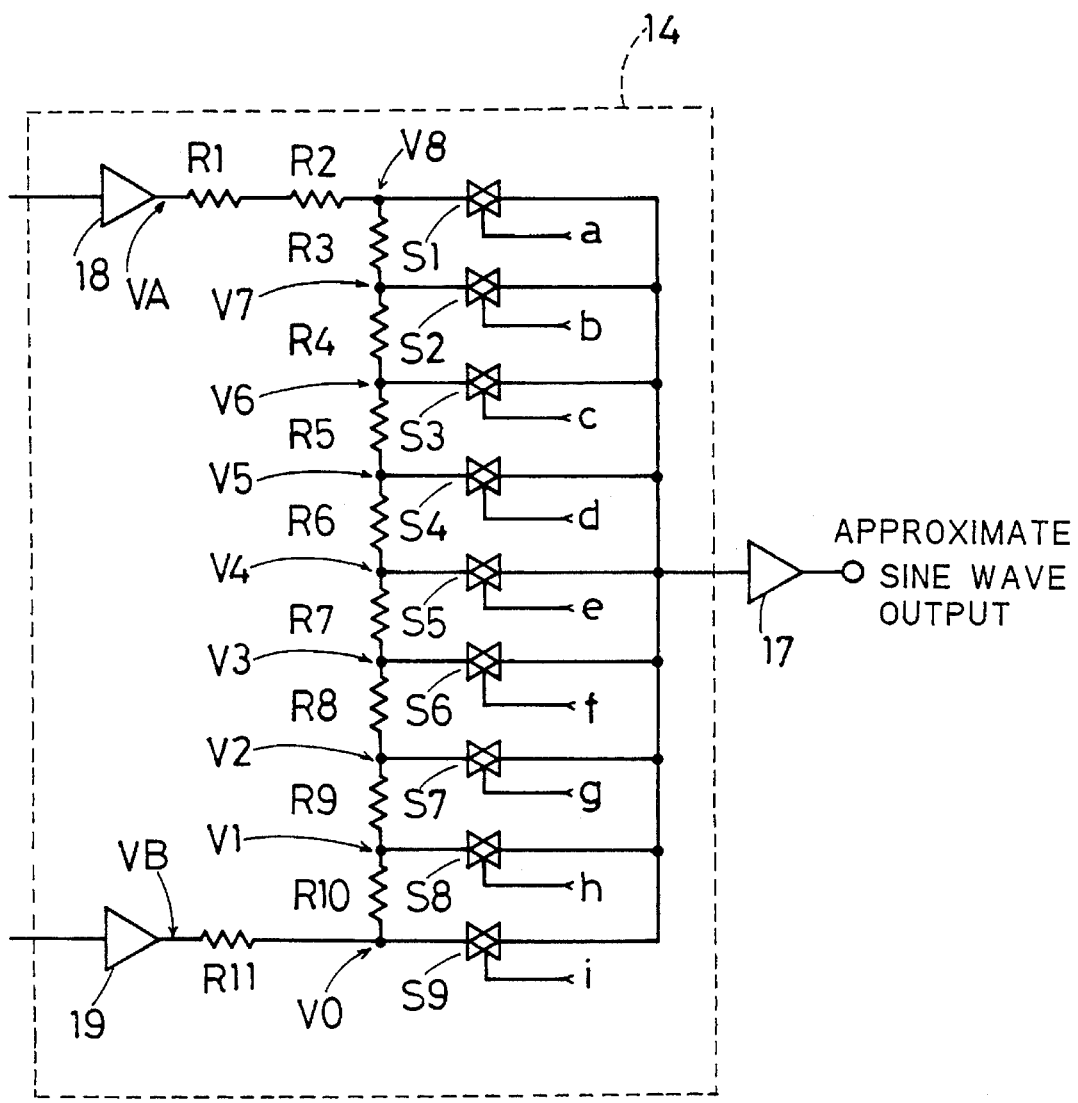
FIG. 3 is a circuit diagram of a major part of a weighted resistor voltage-dividing circuit.

FIG. 3 shows a major part of the weighted resistor voltage-dividing circuit 14. Resistors R1 to R11 are connected in series. The input ends of analog switches S(n–1) are connected to the connections of adjacent resistors Rn and R(n+1) (n=2 to 10).

The output ends of the analog switches S1 to S9 are connected in common to the input end of a buffer 17. A stairlike approximate sine wave described later is outputted from the output end of the buffer 17. The switching control signals Q1 to Q9 of FIG. 1 are inputted to the gates of the analog switches S1 to S9, respectively.

A buffer 18 applies a potential $V_A$ to one end of the resistor R1, and a buffer 19 applies a potential $V_B$ to one end of the resistor R11. The resistors R1 to R11 divide the potentials $V_A$ and $V_B$ to develop potentials V8 to V0 at the input ends of the analog switches S1 to S9. A pair of potentials ($V_A$, $V_B$) applied to the resistors by the buffers 18 and 19 depending on the switching control signals Q0 and Q10 of FIG. 1 are ($V_{D2}$, $V_{S2}$) or ($V_{S2}$, $V_{D2}$). The potentials $V_{D2}$ and $V_{S2}$ are, for example, 5 V and 0 V, respectively.

The resistors R1 to R11 are determined as described below. Initially, the potential V8 is determined as:

$$V8 = (V_A + V_B)/2 \quad (1)$$

From Formula (1) is derived:

$$R1+R2=R+R4+ \ldots +R10+R11 \quad (2)$$

Figure 4:
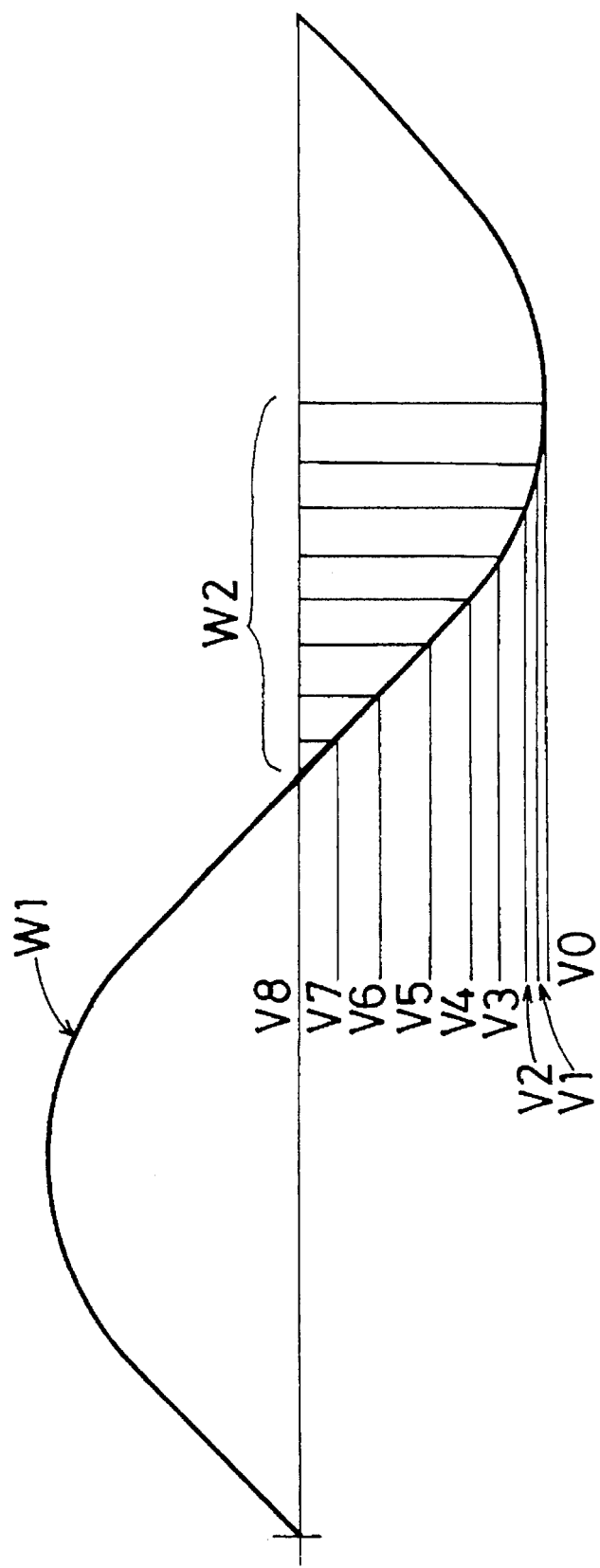
FIGS. 4 to 6 are graphs of the first preferred embodiment.

With reference to FIG. 4, a sine wave W1 centered with respect to the potential V8 has an amplitude equal to the absolute value of (V0–V8). The resistors are determined such that the potentials V0 to V8 are given by dividing into eighths a quarter cycle W2 having a symmetrical characteristic in the sine wave W1. The following relations hold:

$$|V8-V7|/E = \sin(\pi/16) \approx 0.19509$$

$$|V8-V6|/E = \sin(2\pi/16) \approx 0.382683$$

$$|V8-V5|/E = \sin(3\pi/16) \approx 0.55557$$

$$|V8-V4|/E = \sin(4\pi/16) \approx 0.707107$$

$$|V8-V3|/E = \sin(5\pi/16) \approx 0.831469$$

$$|V8-V2|/E = \sin(6\pi/16) \approx 0.923879$$

$$|V8-V1|/E = \sin(7\pi/16) \approx 0.980785 \quad (3)$$

where E is the absolute value of (V0–V8). Therefore the resistors R3 to R10 are determined as follows:

$$R3/r \approx 0.19509$$

$$R4/r \approx 0.187593$$

$$R5/r \approx 0.172887$$

$$R6/r \approx 0.151537$$

$$R7/r \approx 0.124362$$

$$R8/r \approx 0.09241$$

$$R9/r \approx 0.056906$$

$$R10/r \approx 0.019215 \quad (4)$$

where $$r = R3+R4+ \ldots +R9+R10 \quad (5)$$

Thus, when the value of the resistor R11 is determined, the sum of the resistors R1 and R2 is calculated from Formulas (2) and (4).

Figure 5:
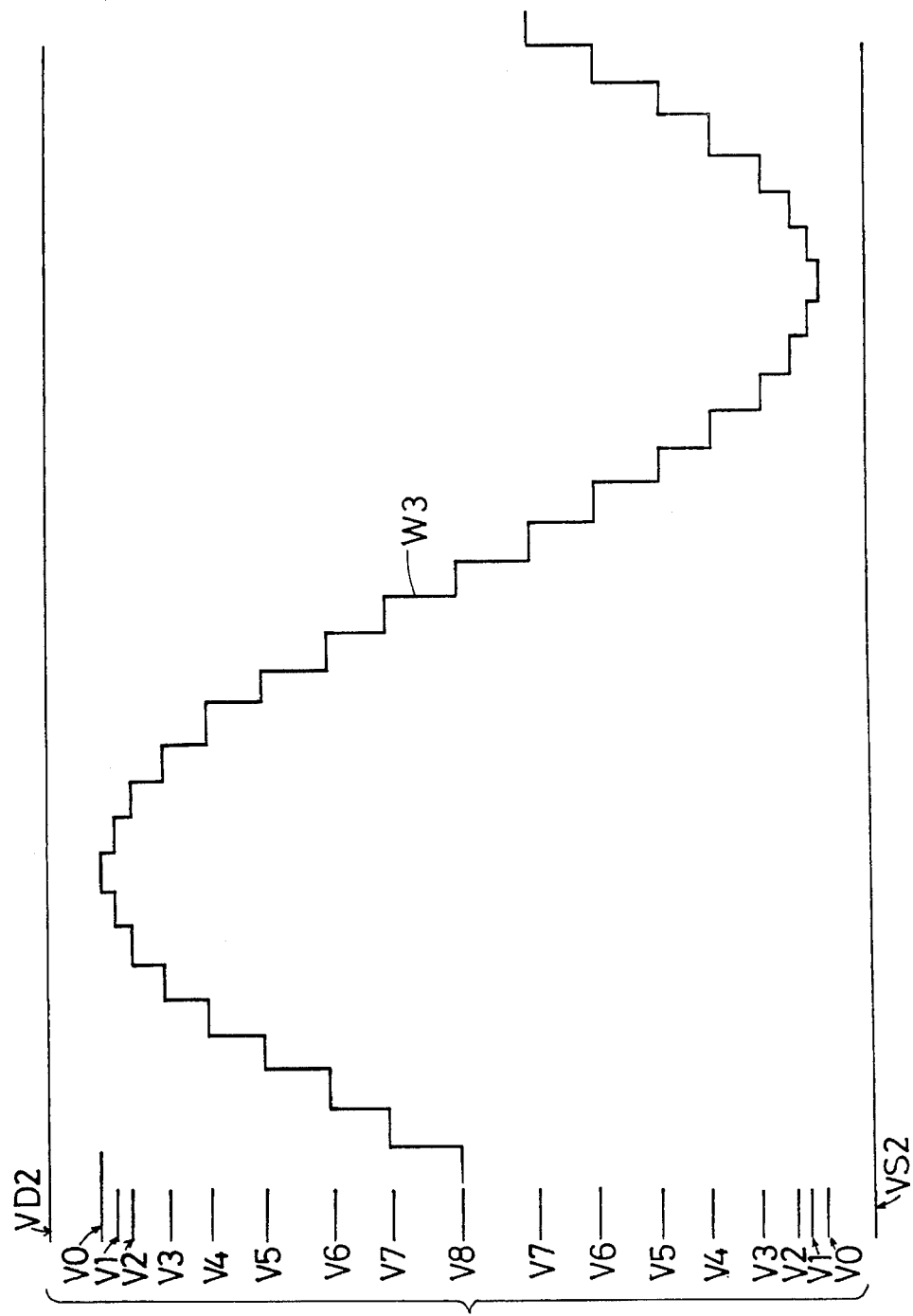
Figure 6:
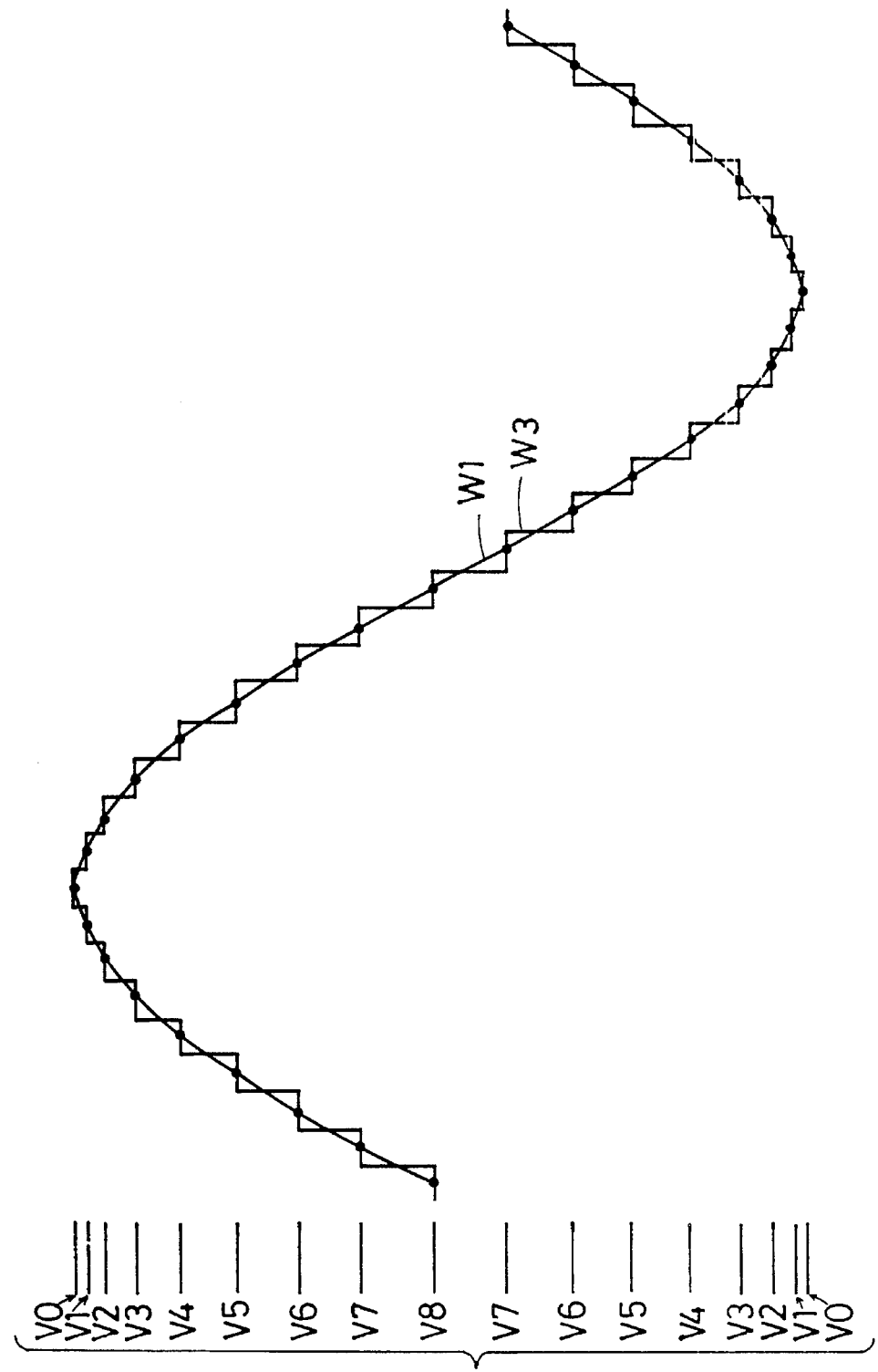
Figure 7:
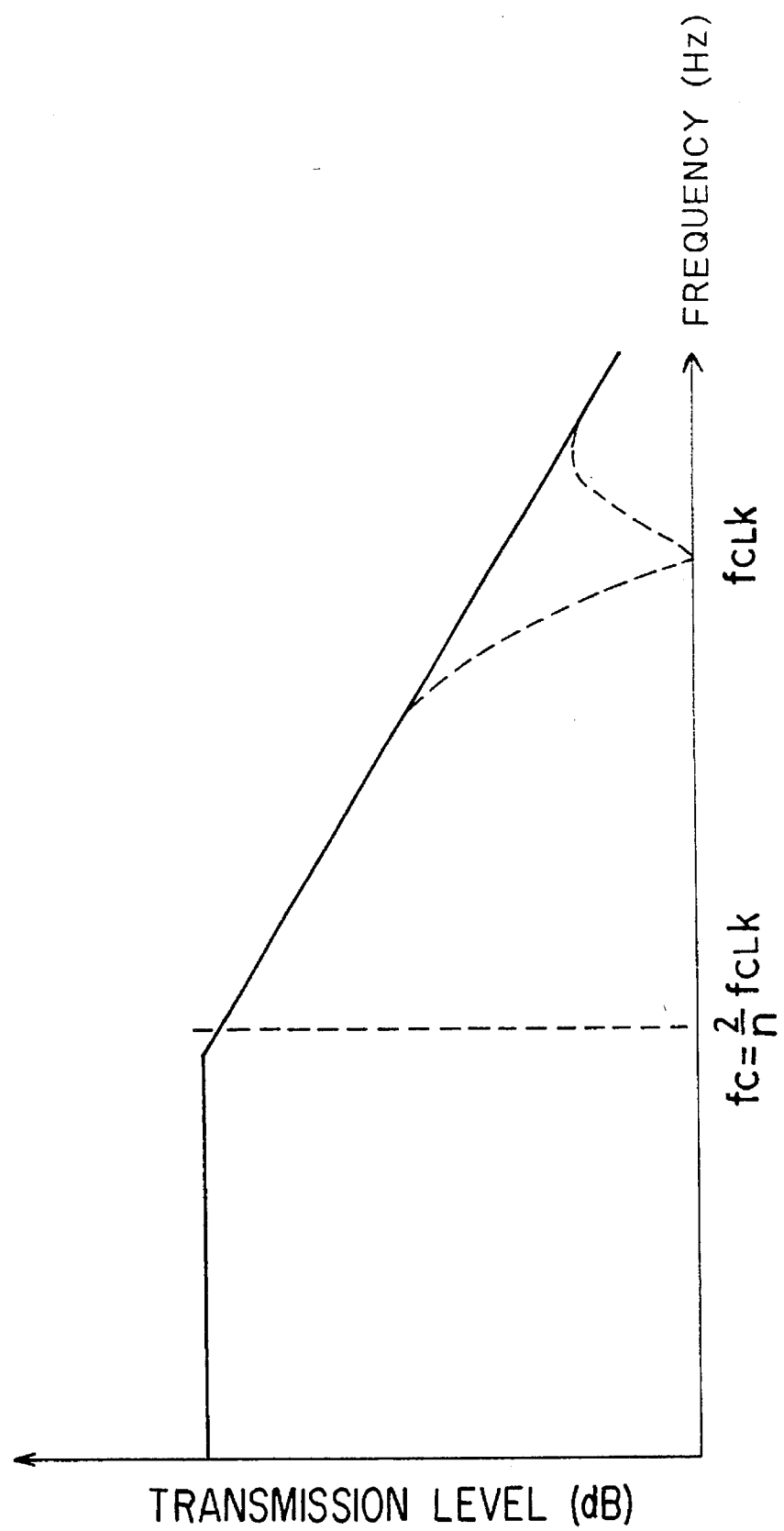
FIG. 7 is a graph showing transmission characteristics of a low pass filter.
Figure 8:
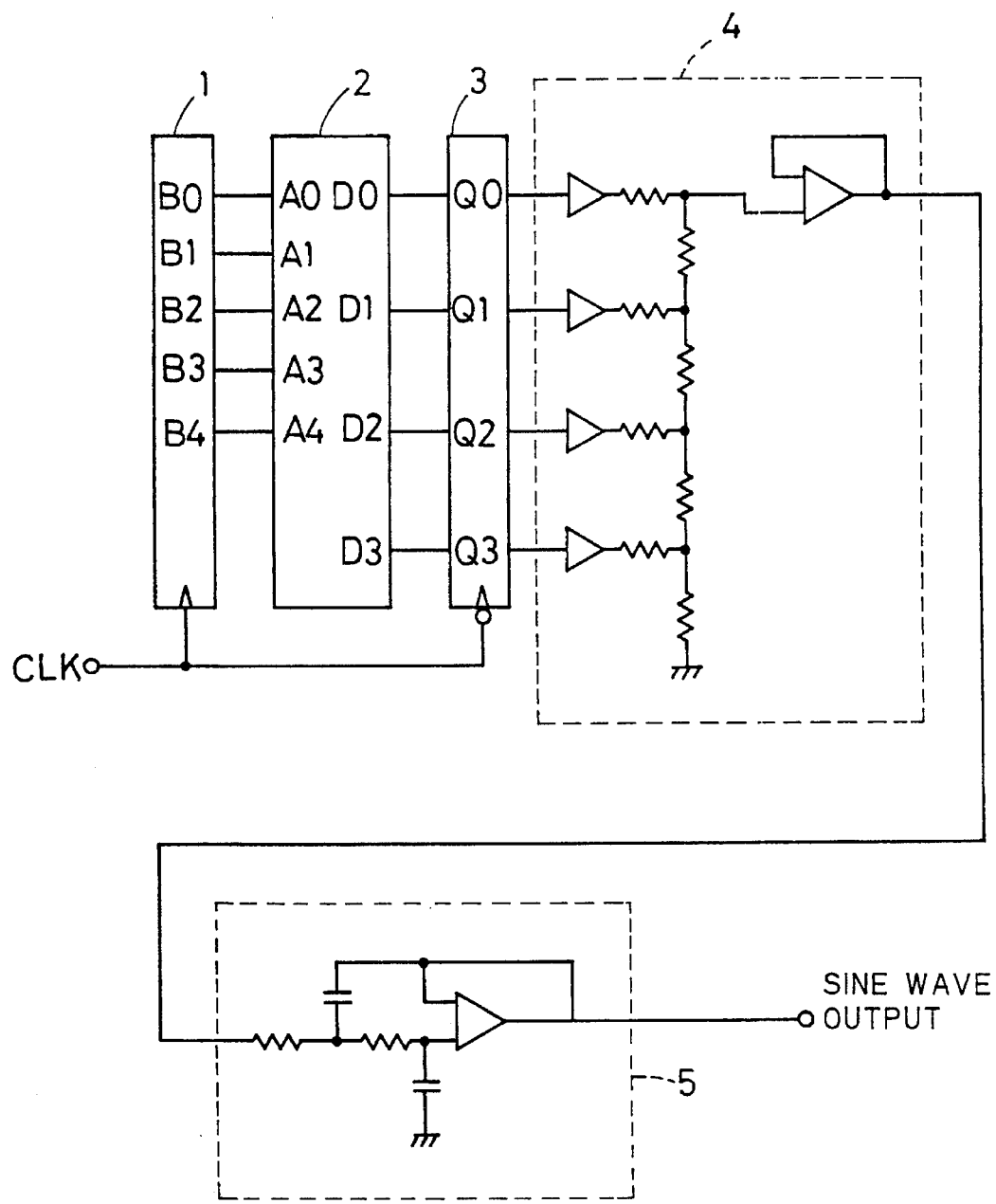
FIG. 8 is a circuit diagram of the background art.
Figure 9:
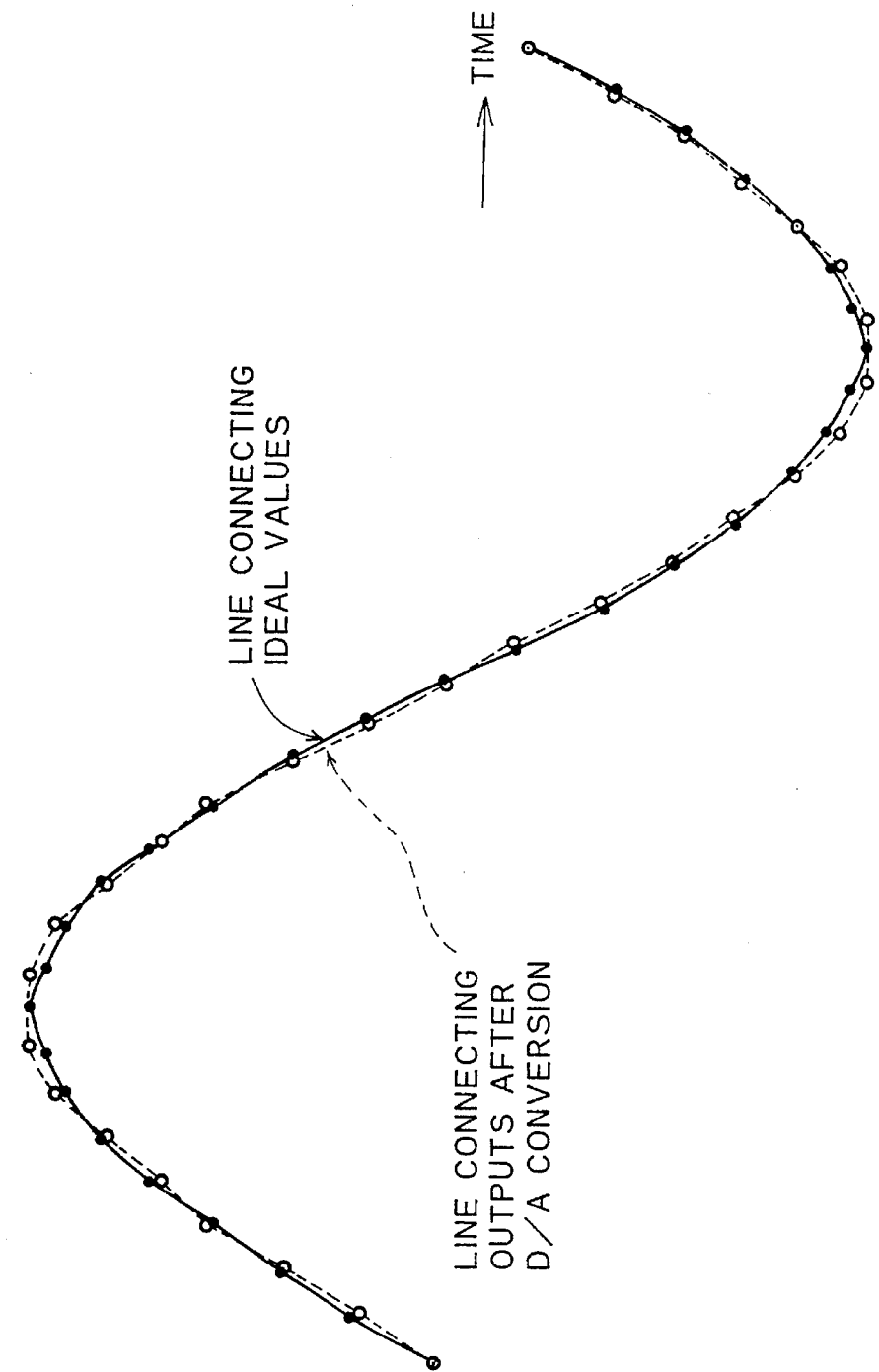
FIG. 9 is a graph of the background art.

The weighted resistor voltage-dividing circuit 14 having such a structure provides the approximate sine wave by appropriately opening and closing the analog switches S1 to S9. When the switch S1 is first closed and the other switches are opened, the potential V8 is outputted through the buffer 17. When the switch S2 is then closed and the other switches are opened, the potential V7 is outputted. When such operations of the switches are carried out one after another while the potentials $V_A$ and $V_B$ which are respectively set to $V_{S2}$ and $V_{D2}$ are applied across the resistors, gradually increasing potentials are outputted from the buffer 17. After the closing of the switch S9, the switches are closed one after another from S8 to S1 with the other switches opened, resulting in gradually decreasing potentials outputted from the buffer 17. Such opening and closing operations of the switches in synchronism with the clock CLK provide an approximate waveform corresponding to a half cycle of the sine wave. Thereafter, the potentials $V_A$ and $V_B$ which are respectively set to $V_{D2}$ and $V_{S2}$ are applied across the resistors. The switches S1 to S9 are opened and closed in the above-mentioned operations to provide an approximate waveform corresponding to the other half cycle. A stairlike approximate sine wave W3 made of the approximate waveforms is shown in FIG. 5. FIG. 6 shows the ideal sine wave W1 in addition to the approximate sine wave W3. The closed circles of FIG. 6 indicative of the centers of step portions of the approximate sine wave W3 lie in the ideal sine wave W1. The quantization errors as being found in the background art are not produced.

Description will be given in detail on processes for opening and closing the switches S1 to S9 in synchronism with the clock CLK and for setting the potentials $V_A$ and $V_B$ to $V_{D2}$ and $V_{S2}$ or vice versa. That is, the operations of the control timing generating circuit 12 for producing the switching control signals D0 to D10 are discussed.

Table 1 shows the order of closing the switches S1 to S9. The switches S1 to S9 in the left column of Table 1 are closed one after another in the order of the numerals shown in the right columns thereof. The timing chart of the switching control signals D0 to D10 is shown in FIG. 2. The numerals 0 to 31 of Table 1 correspond to those of FIG. 2. The switches corresponding to the cells having the numerals in Table 1 are closed at the timings indicated by the numerals on the count result B0 of FIG. 2.

TABLE 1

|  | I | II | III | IV |
|---|---|---|---|---|
| $V_A$ | 0 V | 0 V | 5 V | 5 V |
| $V_B$ | 5 V | 5 V | 0 V | 0 V |
| S1 | 0 |  | 16 |  |
| S2 | 1 | 15 | 17 | 31 |
| S3 | 2 | 14 | 18 | 30 |
| S4 | 3 | 13 | 19 | 29 |
| S5 | 4 | 12 | 20 | 28 |
| S6 | 5 | 11 | 21 | 27 |
| S7 | 6 | 10 | 22 | 26 |
| S8 | 7 | 9 | 23 | 25 |
| S9 |  | 8 |  | 24 |

The weighted resistor voltage-dividing circuit 14 outputs the potentials V8 to V0 by closing the switches S1 to S9, respectively. The switches S1 to S9 are closed one after another in this order at constant time intervals without the simultaneous closing of two or more of them. Since the potentials V8 to V0 have the relationship shown in FIG. 3, the approximate sine wave corresponding to the waveform of the function sinθ (θ=0 to π/2) is provided on condition that the following formula holds:

$$V_A = V_{S2} = 0 \text{ (V)}, \quad V_B = V_{D2} = 5 \text{ (V)} \qquad (6)$$

(See column I of Table 1.)

The waveform of the function sine has four quarter cycles the ranges of which are θ=0 to π/2, θ=π/2 to π, θ=π to 3π/2, θ=3π/2 to 2π, respectively. Since the quarter cycles have symmetrical characteristics, the switches should be closed one after another from S8 to S1 after the closing of the switch S9. This provides the approximate sinθ wave corresponding to the waveform of the function sinθ (θ=π/2 to π). (See the column II of Table 1.) The opening and closing operations of the switches described heretofore provide a half cycle of the approximate sine wave.

The other half cycle of the approximate sine wave is accomplished by repeating the opening and closing operations of the switches S1 to S9 in the columns I and II of Table 1. This is because the waveform of the function sinθ are symmetrical in the half cycle regions θ=0 to π and θ=π to 2π. In the other half cycle, however, the potentials $V_A$ and $V_B$ are reversed so that the following formula must hold:

$$V_A = V_{D2} = 5 \text{ (V)}, \quad V_B = V_{S2} = 0 \text{ (V)} \qquad (7)$$

Since the potential V8 which is given by closing the switch S1 satisfies Formula (1), the potential V8 is not varied by the reversal of the potentials $V_A$ and $V_B$. The opening and closing operations of the switches S1 to S9 shown in the columns III and IV of Table 1 provide the approximate sine wave corresponding to the function sinθ (θ=π to 2π).

The opening and closing operations of the switches S1 to S9 and the reversal of the potentials $V_A$ and $V_B$ are accomplished by the switching control signals D0 to D10 given by:

D0=B4

D1=$\overline{B0}\cdot\overline{B1}\cdot\overline{B2}\cdot\overline{B3}$

D2=B0·$(\overline{B1 \oplus B2})\cdot(B2 \oplus \overline{B3})$

D3=$\overline{B0}\cdot B1\cdot(\overline{B2 \oplus B3})$

D4=B0·$(B1 \oplus B2)\cdot(\overline{B2 \oplus B3})$

D5=$\overline{B0}\cdot\overline{B1}\cdot(B1 \oplus B2)$

D6=B0·$(B1 \oplus B2)\cdot(B2 \oplus B3)$

D7=$\overline{B0}\cdot B1\cdot(B2 \oplus B3)$

D8=B0·$(\overline{B1 \oplus B2})\cdot(B2 \oplus B3)$

D9=$\overline{B0}\cdot\overline{B1}\cdot\overline{B2}\cdot B3$

D10=$\overline{B4}$ (8)

where ⊕ is an exclusive OR.

The operations of the control timing generating circuit 12 are to produce the switching control signals D0 to D10 satisfying Formula (8) from the count results B0 to B4. The control timing generating circuit 12 is easily achieved by means of logic gates. The exclusive OR of the count results B1 and B2 and the exclusive OR of the count results B2 and B3 are also shown in FIG. 2 for ease of understanding. Although FIG. 2 shows ideal timings, the synchronous circuit 13 adjusts the switching control signals D0 to D10 in practice so that the switching control signals Q0 to Q10 are applied to the weighted resistor voltage-dividing circuit 14.

The switching control signals D0 to D10 thus produced open and close the switches S1 to S9 in synchronism with the clock CLK, to provide the approximate sine wave W3 shown in FIG. 5.

The approximate sine wave is generated based on the symmetrical quarter cycles of the sine wave in the first preferred embodiment. Viewed from another angle, this is the generation of the approximate sine wave based on the symmetrical half cycles of the sine wave. In addition, samplings are carried out eight times in the quarter cycle of the frequency of the sine wave in the first preferred embodiment, so that the oversampling ratio is thirty-two times the sine wave (32=4×8). The approximate sine wave having a low distortion factor and high accuracy compared with the circuitry size is obtained by using a smaller or larger oversampling ratio.

The approximate sine wave W3 is subsequently transmitted to a low pass filter 15 to remove high-frequency components therefrom. When the low pass filter 15 having a variable pass band is used, the sine wave generating circuit having a variable frequency is achieved in which the pass band is varied in accordance with the increasing or decreasing frequency of the clock CLK to increase or decrease the frequency of the sine wave to be generated.

The use of a switched capacitor as the low pass filter 15 enables its pass band to vary by controlling its switching frequency. In particular, the switched capacitor has a transmission zero point in its transmission characteristics, and the corresponding frequency or the frequency of the untransmitted signal components is equal to one-half the switching frequency. The frequency of the low pass filter 15 at the transmission zero point becomes equal to the frequency fCLK of the clock CLK by the switching of the switched capacitor at the frequency twice the frequency fCLK of the clock CLK, so that the high-frequency components in the approximate sine wave is well removed.

For this purpose, an original clock signal RCL having the frequency of 2fCLK is applied to the low pass filter 15 and are frequency-divided by two by a frequency divider 16, so that the clock CLK having the frequency of fCLK is applied to the counter 11 and synchronous circuit 13. Increase in frequency of the sine wave to be generated is achieved by increasing the frequency of the original clock signal RCL and, accordingly, the frequency of the clock CLK. In this case, the frequency of the low pass filter at the transmission zero point increases as the frequency of the original clock signal RCL increases. When, the frequency of the sine wave to be generated is decreased, it is vice versa. Thus, the frequency of the sine wave to be generated is controlled by the frequency of the original clock signal. The high-frequency components are well removed without regard to increase or decrease in the frequency of the original clock signal.

It is preferable that the connection of the resistors R2 and R3 is grounded through a capacitor 20 as shown in FIG. 1. This is to remove pulse noises generated during the switching of the potentials $V_A$ and $V_B$.

Since the weighted resistor voltage-dividing circuit 14 generates an analog potential, a power source for supplying the potentials $V_{D2}$ and $V_{S2}$ used for the weighted resistor voltage-dividing circuit 14 is preferably different from a power source for supplying the potentials $V_{D1}$ and $V_{S1}$ for use in digital circuits such as the counter 11, control timing generating circuit 12, synchronous circuit 13.

While the invention has been shown and described in detail, the foregoing description is in all aspects illustrative and not restrictive. It is therefore understood that numerous modifications and variations can be devised without departing from the scope of the invention.

I claim:

1. A sine wave generating circuit comprising:
   control means for producing a switching control signal from clock pulses having a first frequency;
   a weighted resistor voltage-dividing circuit controlled by said control means for receiving first and second potentials and for voltage-dividing a potential difference between said first and said second potentials to generate a plurality of corresponding potentials, said weighted resistor voltage-dividing circuit extracting said corresponding potentials sequentially in synchronism with said clock pulses to generate an approximate sine wave having a second frequency; and
   a low pass filter for filtering said approximate sine wave; wherein said control means includes:
   a counter circuit for counting said clock pulses to output a binary logic; and
   a control timing generating circuit for converting said binary logic into said switching control signal; and
   wherein said weighted resistor voltage-dividing circuit includes:
   a resistor group having a plurality of resistors connected in series, said potential difference being applied across said resistor group;
   a switch group having a plurality of switches operative to open and close by said switching control signal; and
   an output end connected to respective one ends of said switches in common for outputting said corresponding potentials,
   said resistor group including a plurality of connections each connecting adjacent ones of said resistors to the other end of one of said switches, and
   said first and second potentials are reversed when an output corresponding potential has a value equal to half a sum of said first and second potentials.

2. The sine wave generating circuit of claim 1, wherein one of said connections having only one other of said connections adjacent thereto is a midpoint potential point to which a potential at a midpoint of said potential difference is applied.

3. The sine wave generating circuit of claim 2, wherein said mid-point potential point is connected to one end of a capacitor, said capacitor being grounded on the other end.

4. The sine wave generating circuit of claim 3, wherein a ratio of said first frequency to said second frequency is a first integer.

5. The sine wave generating circuit of claim 4, wherein said weighted resistor-dividing circuit serially generates potentials which form quarter waveforms of a sine wave of one cycle.

6. The sine wave generating circuit of claim 4, wherein said weighted resistor voltage-dividing circuit generates corresponding potentials corresponding to halved waveforms of a sine wave, said halved waveforms having a symmetrical characteristic.

7. The sine wave generator circuit of claim 5,
   wherein said switches included in said switch group are a second integer in number,
   wherein a third integer is less than said second integer by one, and said first integer is four times said third integer, and
   wherein normalized values of said corresponding potentials are selected among:

$$\sin(A\pi/2B),$$

where:
   A is an integer not less than zero and not more than said third integer, and
   B is said third integer.

8. The sine wave generating circuit of claim 7, wherein only one of said switches is constantly closed, and
   wherein said switches are closed one after another in predetermined order, said order being in reciprocating relation to said switches without closing the same switch consecutively twice.

9. The sine wave generating circuit of claim 8, wherein said first and second integers are thirty-two and nine, respectively.

10. The sine wave generating circuit of claim 9, wherein said switches are analog switches, said switching control signal being inputted to gates of said analog switches.

11. The sine wave generating circuit of claim 10, wherein said weighted resistor voltage-dividing circuit further includes buffer circuits connected to respective ends of said resistor group.

12. The sine wave generating circuit of claim 11, wherein said buffer circuits apply across said resistor group said potential difference having a polarity, said polarity being reversed when one of said switches which is connected to said mid-point potential point is closed.

13. The sine wave generating circuit of claim 12, wherein a power source for said buffer circuits is independent of power sources for said oscillating circuit and said low pass filter.

14. The sine wave generating circuit of claim 13, further comprising a synchronous circuit for adjusting a timing of said switching control signal to be synchronous with a timing of said clock pulse.

* * * * *